United States Patent
Schillaci et al.

(10) Patent No.: US 7,231,487 B2
(45) Date of Patent: Jun. 12, 2007

(54) AUTOMATIC DECODING METHOD FOR MAPPING AND SELECTING A NON-VOLATILE MEMORY DEVICE HAVING A LPC SERIAL COMMUNICATION INTERFACE IN THE AVAILABLE ADDRESSING AREA ON MOTHERBOARDS

(75) Inventors: Paolino Schillaci, Casteltermini (IT); Salvatore Poli, Mascaluga (IT); Antonino La Malfa, Catania (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 367 days.

(21) Appl. No.: 10/623,474

(22) Filed: Jul. 18, 2003

(65) Prior Publication Data
US 2004/0083327 A1   Apr. 29, 2004

(30) Foreign Application Priority Data
Jul. 18, 2002   (IT)   ............ MI2002A1583

(51) Int. Cl.
*G06F 12/00* (2006.01)
*G06F 13/00* (2006.01)

(52) U.S. Cl. ............ 711/1; 711/103; 711/108; 711/154

(58) Field of Classification Search ............ 711/1, 711/100, 154, 170, 103, 108
See application file for complete search history.

(56) References Cited

U.S. PATENT DOCUMENTS

| | | | | |
|---|---|---|---|---|
| 5,291,448 | A | * | 3/1994 | Conan ............ 365/201 |
| 5,485,589 | A | * | 1/1996 | Kocis et al. ............ 711/213 |
| 5,790,831 | A | * | 8/1998 | Lin et al. ............ 710/315 |
| 5,946,263 | A | * | 8/1999 | Takahashi ............ 365/230.06 |
| 6,119,226 | A | * | 9/2000 | Shiau et al. ............ 713/2 |
| 6,240,046 | B1 | * | 5/2001 | Proebsting ............ 365/233 |

* cited by examiner

*Primary Examiner*—Tuan V. Thai
(74) *Attorney, Agent, or Firm*—Lisa K. Jorgenson; David V. Carlson; Seed IP Law Group PLLC

(57) ABSTRACT

The invention relates to an automatic decoding method for mapping and selecting a non-volatile memory device having a LPC serial communication interface in the available addressing area on motherboards. A logic structure is incorporated in the memory device, which allows a correct decoding to address the memory to the top of the addressable area or to the bottom of the same area, i.e., in both possible cases. This logic incorporates a non-volatile register whose information is stored in a Content Address Memory to enable the automatic mapping of the memory in the addressable memory area.

15 Claims, 9 Drawing Sheets

AUTOMATIC DECODING METHOD FOR MAPPING AND SELECTING A NON-VOLATILE MEMORY DEVICE HAVING A LPC SERIAL COMMUNICATION INTERFACE IN THE AVAILABLE ADDRESSING AREA ON MOTHERBOARDS

BACKGROUND OF THE INVENTION

1. Field of the Invention

The present invention relates to an automatic decoding system for addressing a memory on a motherboard of an electronic processor of the PC Personal Computer type.

More particularly, but not exclusively, the invention relates to the hardware implementation of the automatic decoding for addressing in a PC motherboard in the available memory area of a flash memory equipped with at least an interface with LPC (Low Pin Count) serial protocol.

The present invention also relates to an electronic memory device monolithically integrated on a semiconductor and equipped with a pseudo-parallel interface.

More particularly, but not exclusively, the invention relates to a Flash memory for standard applications integrated with a LPC (Low Pin Count) interface block, used during normal operation applications, and with a parallel interface block, used almost exclusively during the testing step.

2. Description of the Related Art

The integrated electronic device to which the memory invention applies is a Flash memory for PC Intel-like motherboard applications and it has externally eleven address pins, eight data pins and some control pins among which the synchronism or clock signal CLK and a setting signal of the two interfaces IC.

The memory device of the invention is equipped with two communication interfaces: the one parallel or pseudo-parallel, A/Amux interface, and the other serial, LPC interface.

The first is intended to perform fast preprogramming operations before mounting the memory on the motherboard or during the device-testing step with automated testing equipment (ATE). The second is used during the normal personal computer operation.

There is a selection signal, called IC, allowing to pass from an operation interface to the other.

At present, the software for testing flows both at the EWS level (Testing on wafer) and at the Final Test level (Testing on assembled device) has been conceived for a parallel-mode operation. Substantially, in the testing step all considered addresses and data are supplied in the parallel mode, while only the clock signal CLK and other four pins are necessary for the serial communication protocol.

As it is well known in this specific technical field, the reading operation of a memory location of the cell matrix implies first of all the address of the location itself to pass.

The here-attached FIG. 1 schematically shows the structure of a motherboard of an electronic processor 1 of the PC type. As it can be seen in FIG. 1, blocks 2 and 3, called I/O Controller and Memory Controller, are intended to put a motherboard processor 10 and the system peripherals 6, 7 into communication with a memory 5 wherein the device operating system BIOS is stored; this occurs for each type of operation.

The other system blocks 8, 9 are those allowing the processor 1 to interface the external world and they are underlined in this case for descriptive purposes only.

Further four pins called ID<3:0> are available, among the others, in the integrated memory circuit, through which it is possible to address several memories in the same system in the LPC mode. The block intended to manage the addressing in the available memory area is the Memory Controller 3.

The selection process of a predetermined memory among several memories available in the system is now described in greater detail.

Each memory has four ID pins. With four available bits it is possible to have up to $2^4=16$ different combinations.

This means that, by setting the highest addressable memory area at 64-Mbit, it is possible to address up to sixteen four-Mbit memories or eight eight-Mbit memories. Moreover, in the highest addressing area, it is possible to have memories simultaneously having the same or different size, respecting the available addressing area.

As it can be seen in the matrix scheme of FIG. 2, by addressing eight-Mbit memories and four-Mbit memories respectively, different patterns can be obtained. In fact an eight-Mbit memory can be followed by eight-Mbit memories or by two four-Mbit memories, but if the first addressable memory is a four-Mbit memory, four-Mbit memories can follow, for overall 8 Mbits, and only after 8-Mbit memories since the area windows addressable by the controller 3 can be either four-Mbit or eight-Mbit and higher-capacity devices (eight Mbits in this case) delimit the highest addressable window.

In summary, in other words, if the first addressable memory is a four-Mbit memory, only a four-Mbit memory can follow for 8 Mbits at the most.

Therefore, the second column of FIG. 2 shows an impossible case in reality.

The controller 3 function is to select the memory to be addressed. This controller 3 comprises a BIOS selection register comprising the information required for mapping memories correctly.

Memories are mapped in the addressing area through the addressing ID pins.

Supposing that the first memory, i.e., the one with ID<3:0>=0000, is to be mapped at the top of the addressing area, the following memories have ID<3:0>=0001, 0010 and soon increasing by one bit the address of the memory to be mapped with respect to the already mapped memory.

Assuming the above, in order to map several memories in the same system, ID pins of each memory are located at the hardware level in a corresponding. logic address. The LPC communication protocol helps at this point to understand which memory the controller 3 wants to talk to. In fact, as it can be seen in FIG. 3, after the protocol starting step and the "cycletype" step, specifying which reading or writing operation is to be performed, eight clock cycles occur in which the memory is polled to pass the memory location address on which the operation is to be performed. It is worth noting that, when performing the LPC protocol, information is always exchanged through a four-bit bus. Since, to address a location of an eight-Mbit memory, twenty bits are necessary and eight clock cycles are available in the LPC protocol in correspondence of which it is possible to pass 32 bits, not all passed bits are necessary for the addressing.

It is therefore possible to select four of these 32 bits to be used for comparison with ID pins and to know from the bit-to-bit correspondence which memory is polled, i.e., addressed, to perform the above-mentioned operation. It is possible to use, for example, the bits A<31:25> for the mapping and the bits A<24:21> for the comparison with ID pins. In case of matching between these bits it is worth continuing with the remaining protocol to complete the operation required.

It is usually assumed that the first memory to be addressed is put at the top of the addressable area and that ID pins are then increased and the logic addresses decreased.

The matching between address bits and ID pins in a Top_Down addressing can be seen for example in the following table:

TABLE 1

| Memory Number | ID3 | ID2 | ID1 | ID0 | A24 | A23 | A22 | A21 |
|---|---|---|---|---|---|---|---|---|
| 1(Boot) | 0 | 0 | 0 | 0 | 1 | 1 | 1 | 1 |
| 2 | 0 | 0 | 0 | 1 | 1 | 1 | 1 | 0 |
| 3 | 0 | 0 | 1 | 0 | 1 | 1 | 0 | 1 |
| 4 | 0 | 0 | 1 | 1 | 1 | 1 | 0 | 0 |
| 5 | 0 | 1 | 0 | 0 | 1 | 0 | 1 | 1 |
| 6 | 0 | 1 | 0 | 1 | 1 | 0 | 1 | 0 |
| 7 | 0 | 1 | 1 | 0 | 1 | 0 | 0 | 1 |
| 8 | 0 | 1 | 1 | 1 | 1 | 0 | 0 | 0 |
| 9 | 1 | 0 | 0 | 0 | 0 | 1 | 1 | 1 |
| 10 | 1 | 0 | 0 | 1 | 0 | 1 | 1 | 0 |
| 11 | 1 | 0 | 1 | 0 | 0 | 1 | 0 | 1 |
| 12 | 1 | 0 | 1 | 1 | 0 | 1 | 0 | 0 |
| 13 | 1 | 1 | 0 | 0 | 0 | 0 | 1 | 1 |
| 14 | 1 | 1 | 0 | 1 | 0 | 0 | 1 | 0 |
| 15 | 1 | 1 | 1 | 0 | 0 | 0 | 0 | 1 |
| 16 | 1 | 1 | 1 | 1 | 0 | 0 | 0 | 0 |

In order to address the memory being at the top of the addressable area it is conventionally necessary to pass through the address bits A<24:21> the value 1111 while for the following memory the value 1110 and so on. The following memory, as such, must have, for ID pins, a value being increased by one with respect to the pin ID value of the previous memory, but, since a top toward bottom addressing is performed, the logic address must decrease.

This implies that a logic is provided in the memory, which allows the comparison among ID pins and address bits.

If the first memory is to be put in correspondence with the least significant bit according to an opposed bottom-up convention, this logic should be modified to allow a one-to-one comparison between ID pins and address bits, i.e., to address the lowest memory (with ID<3:0>=0000) the value 0000 instead of 1111 should be given to the address bits A<24:21>.

Therefore, if the first memory is to be mapped at the most significant bit or at the least significant bit, i.e., at the top or bottom of the addressable memory area, a different decoding must be provided in the two cases.

The present invention is grafted on this technical problem to provide an innovative automatic decoding mode for mapping a non volatile memory device, particularly of the Flash type, having a LPC (Low Pin Count) serial communication interface and in the motherboard available addressing area.

BRIEF SUMMARY OF THE INVENTION

The solution idea underlying the present invention is to provide a logic allowing a correct decoding to address a memory to the top of the addressable area or to the bottom of the same area, i.e., in both possible cases. Such a logic should incorporate a non-volatile register whose information is stored in a CAM (Content Address Memory) to enable the automatic memory mapping in the addressable memory area.

Substantially, while in the prior art the top-down or bottom-up addressing of the addressable area is conventionally fixed and, consequently, a memory allowing the one or the other type of addressing is used, according to the invention the logic structure enabled by the CAM allows the type of memory area addressing to be disregarded and, according to the addressing mode used, the logic automatically recognizes the top-down or bottom-up mapping.

Therefore any memory can be used apart from the addressing type.

On the basis of this solution idea the invention provides an automatic decoding method for mapping and selecting a non volatile memory device having a LPC serial communication interface, characterized in that it provides a comparison between said addressing pins of each memory and a portion of the addressing coding bits both to identify the addressing type to be used, top-down or bottom-up, and to determine which memory is polled by the controller for a given operation.

The invention also relates to an integrated non volatile memory device equipped with at least an interface with LPC serial protocol and some addressing pins to be mounted on a motherboard together with other memories of the same type bidirectionally connected with a controller putting it into communication with a processor housed in turn on the motherboard, characterized in that it comprises in the LPC interface a logic identification structure both of the memory and of the addressing type to be used, top-down or bottom-up; said logic structure comprising at least a comparator to compare a portion of the addressing coding bits with said addressing pins.

The features and advantages of the method and the device according to the invention will be apparent from the following description, of an embodiment given by way of non-limiting example with reference to the attached drawings.

DETAILED DESCRIPTION OF THE INVENTION

Figure 5:
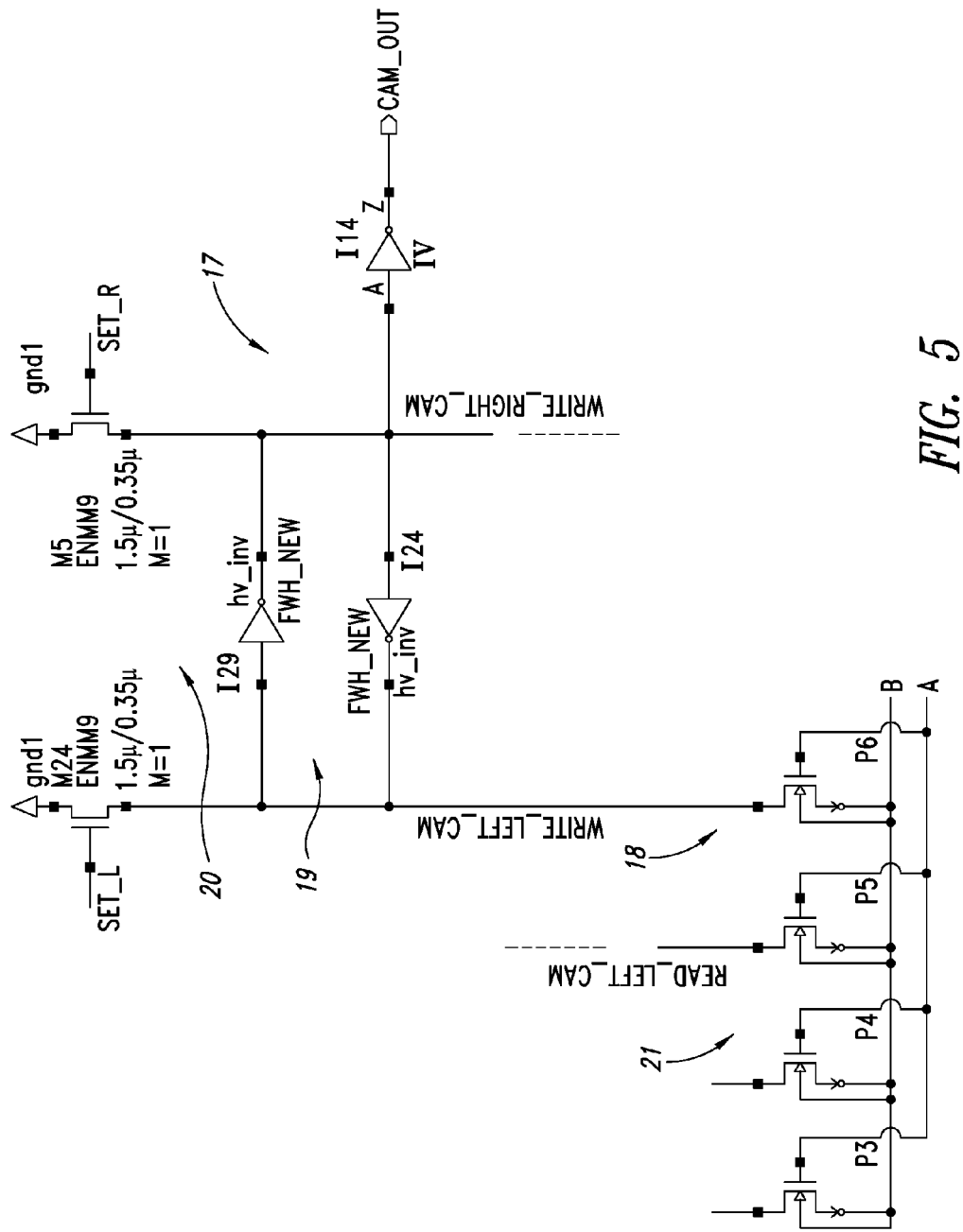
FIG. 5 shows a detail of the logic structure according to the invention.

With reference to the drawings, and particularly to the example of FIG. 5, a logic structure according to the present invention for the automatic decoding and mapping of a non-volatile memory device 5, particularly of the Flash type, is globally and schematically indicated with 10.

Figure 1:
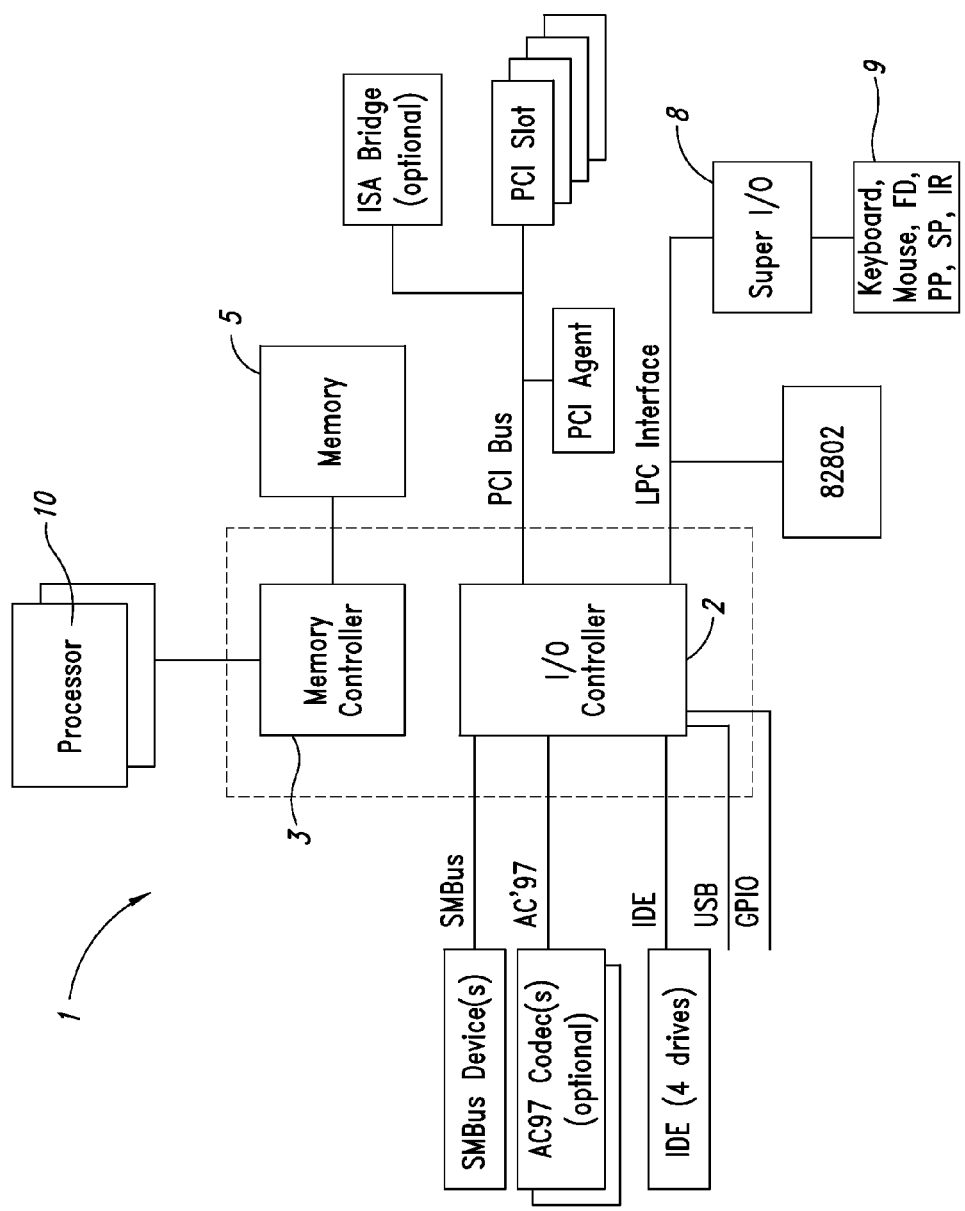
FIG. 1 is a schematic block view of the motherboard structure of a known PC (Personal Computer) electronic processor.
Figure 2:
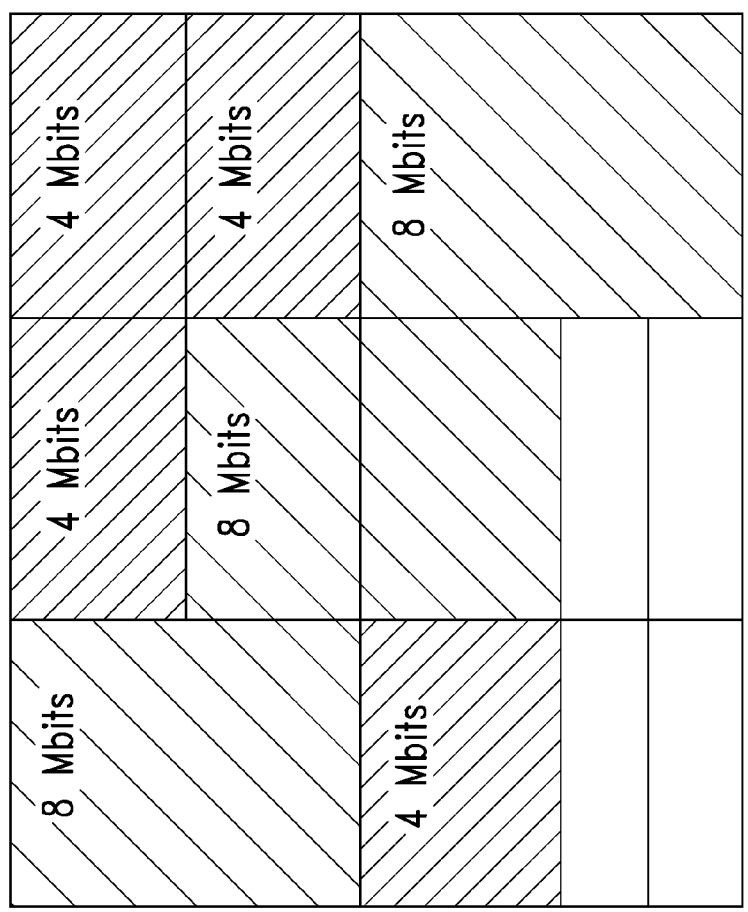
FIG. 2 is a schematic view showing the addressing modes of memories having different sizes.
Figure 3:
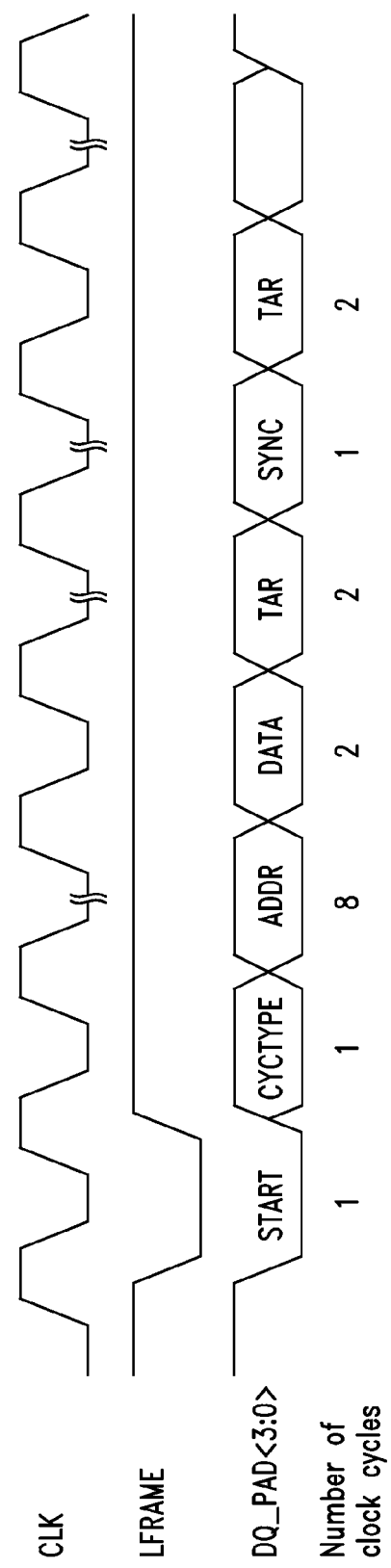
FIG. 3 shows in an equally-time-based diagram the trend of driving signals of the non-volatile memory mapping step according to known modes.

The device 5 can be also incorporated in the motherboard of FIG. 1 together with other memories of the same type; therefore the logic structure 10 makes the memory device 5 capable of implementing the method according to the invention but it does not require particular arrangements of the motherboard 1 wherein the memory device can be incorporated.

The memory 5 has a LPC (Low Pin Count) serial communication interface.

The architecture according to the invention allowing the automatic decoding of the memory 5 addressing is now described in detail.

Advantageously, the logic 10 allows a correct decoding to address the memory 5 to the top of the addressable area or to the bottom of the same area, i.e., in both possible cases. The logic 10 is associated with a non-volatile register 16 whose information is stored in a so-called CAM (Content Address Memory) 17 to enable the automatic mapping of the memory 5 in the addressable memory area.

Substantially, while in the prior art the top-down or bottom-up addressing of the addressable area is conventionally fixed and, consequently, a memory allowing the one or the other type of addressing is used, according to the invention the logic structure 10, enabled by the CAM 17, allows the type of memory area addressing to be disregarded and, according to the addressing mode used, the logic 10 automatically recognizes the top-down or bottom-up mapping.

Therefore, any memory 5 can be selected independently from the addressing type.

Figure 4:
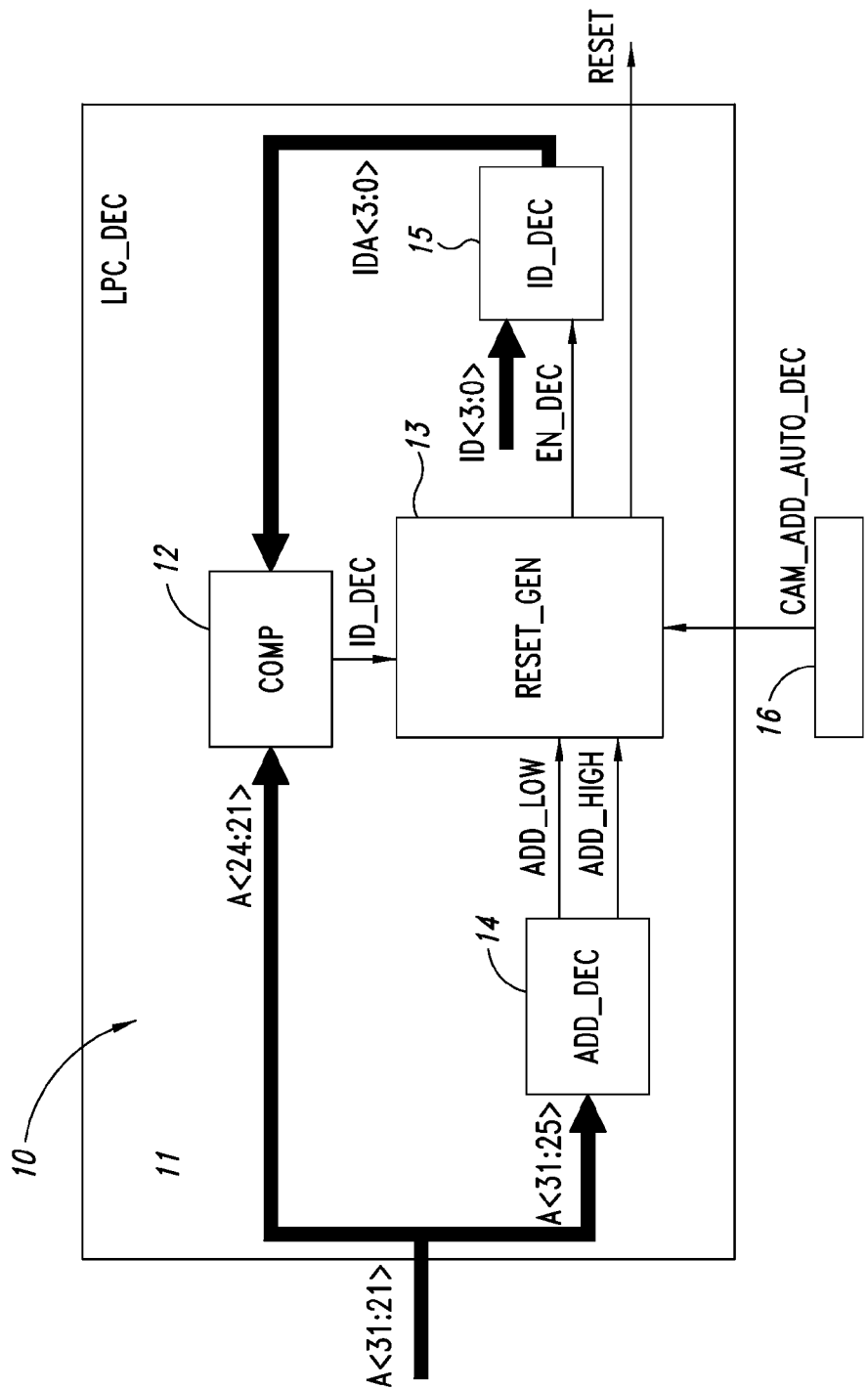
FIG. 4 is a schematic block view of a logic structure intended to automatically decoding the non-volatile memory addressing.

As it can thus be seen from the block scheme of FIG. 4, the most significant address bits A<31:21> intended for the addressing enter a LPC decoding block 11, particularly bits A<31:25> serve to identify the top-down or bottom-up addressing type while some other intermediate bits A<24:21> are used for the comparison with pins ID<3:0>, in a comparator block 12, to determine which memory is polled by the controller 3 for the concerned operation.

Bits A<31:25> are applied to a selector block 14 intended to generate two different signals ADD_LOW and ADD_HIGH which are both at a low logic value LOW if the addressing is bottom-up (A<31:25>=%b_0) or top-down (A<31:25>=%b_1) respectively.

On the contrary, if the signals are both at a high logic value HIGH, i.e., if neither of the two above-mentioned addressing occurs, they determine a reset pulse, generated by a generator block 13 RESET_GEN, which reboots a state machine outside the logic 10 and which is intended to perform the LPC communication protocol.

Signals ADD_LOW and ADD_HIGH are processed in the same generator block 13 and they determine the signal EN_DEC.

This enabling signal EN_DEC allows pins ID<3:0> or the negatives thereof to be selected, which are compared in the comparator 12 with the other bits A<24:12>. If the comparison has a negative result, a high-logic-value signal ID_DEC is outputted by the comparator block 12 to generate a state machine reset pulse once again.

The structure of the CAM 17 is shown in FIG. 5; more particularly, this Figure only shows a circuit portion of the CAM left branch since the right branch structure is perfectly symmetrical and, for simplicity purposes, only one of the two twin portions is represented.

The CAM 17 comprises three FLASH memory cells, indicated with 21, parallel-connected to each other and intended to read the information contained therein. A further FLASH cell 18 has the gate and source in common with the previous three cells and different drain intended to write the information.

An inverter latch 19 receives on its inputs the right and left writing circuit branches associated to the cell 18.

In fact the latching between the left part and the right part determines the value of the output signal CAM_OUT serving to enable the decoding logic 10.

A bias circuit portion 20 completes the CAM 17 structure.

The above-described logic 10 operation is explained also by the following truth table indicating the logic values of the various signals according to the comparison results:

TABLE 2

| ADD_LOW | ADD_HIGH | EN_DEC | NOTES | COMPARE |
|---|---|---|---|---|
| 0 | 0 | — | NO POSSIBLE | NO POSSIBLE |
| 0 | 1 | 1 | A<31:25>=L | A<24:21> vs ID<3:0> |
| 1 | 0 | 0 | A<31:25>=H | A<24:21> vs ID_N<3:0> |
| 1 | 1 | 0 | RESET | RESET |

The impossible case (NO POSSIBLE) is due to the fact that the most significant addresses A<31:25> cannot be simultaneously low and high. The reset case is due to the fact that there are no low or high addresses A<31:25>.

A confirmation of the results of the method according to the invention is obtained from simulation tests performed by the Applicant.

For the simulations it has been envisaged to use a memory. addressed with pin ID<3:0>=0000.

Figure 6:
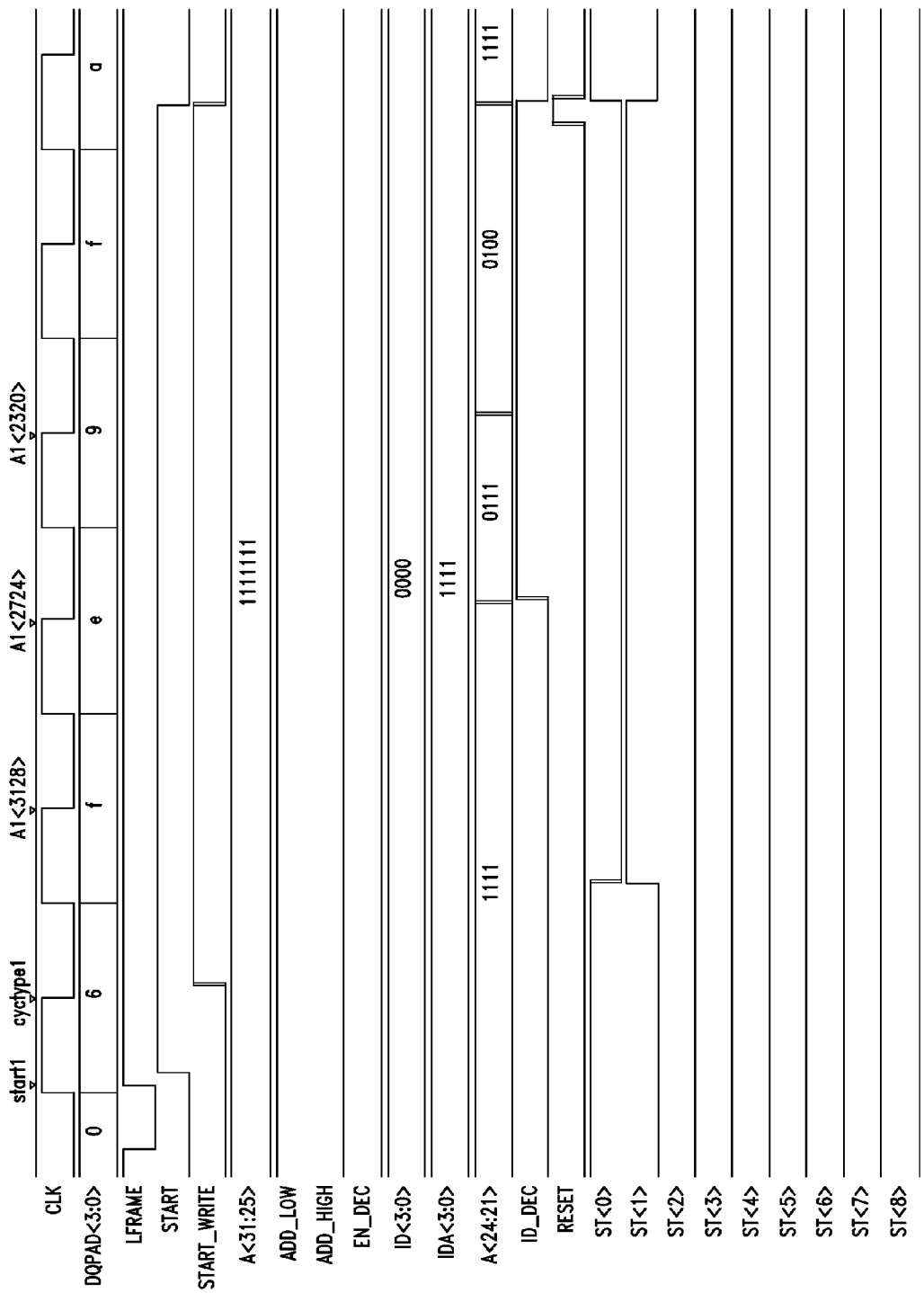
FIG. 6 shows the trend of a set of equally-time-based logic signals during a simulation of the operation of the logic of FIG. 5 with the following signal levels: A<31:25>=H, A<24:21> vs ID gives a negative result.

From FIG. 6 it can be seen that, as mentioned above, the protocol LPC provides a starting step having a rise front of the signal START indicating the operation start and a "cycletype" step specifying the type of operation to be performed, in the here-described non limiting example it is a writing operation, in correspondence of which the signal START WRITE rises. These steps are characterized by the same state machine state ST<0>. Afterwards, in the state ST<1>, the address passes in groups of four bits at a time.

Afterwards, in succession, the remaining steps corresponding to the states ST<4:7> are performed. The bus intended to pass addresses and data is identified by the abbreviation DQPAD<3:0>.

FIG. 6 indicates the case in which A<31:25>=H, in fact ADD_HIGH is low, but A<24:21> are not all high (ID_DEC high), the comparison with the IDs gives thus a negative result starting a reset.

Figure 7:
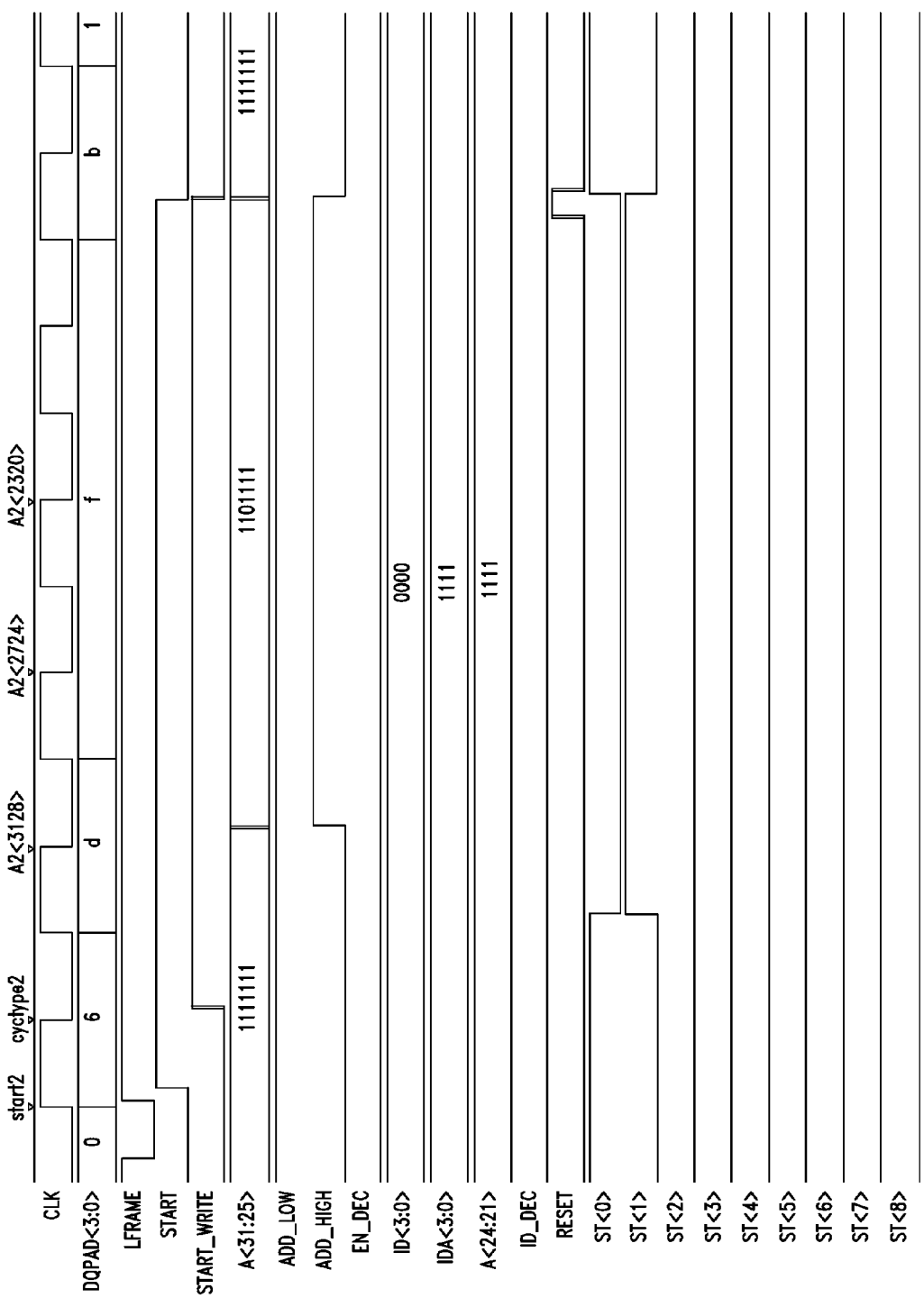
FIG. 7 shows the trend of a set of equally-time-based logic signals during a simulation of the operation of the logic of FIG. 5 with the following addressing bit values: A<31:25> any, A<24:21>=High.

On the contrary, FIG. 7 examines the case in which the logic values of the addresses A<31:25> are any, (ADD_LOW=ADD_HIGH=H), starting a reset even if the following addresses A<24:21> get through the comparison with the IDs (ID_DEC=L).

Figure 8:
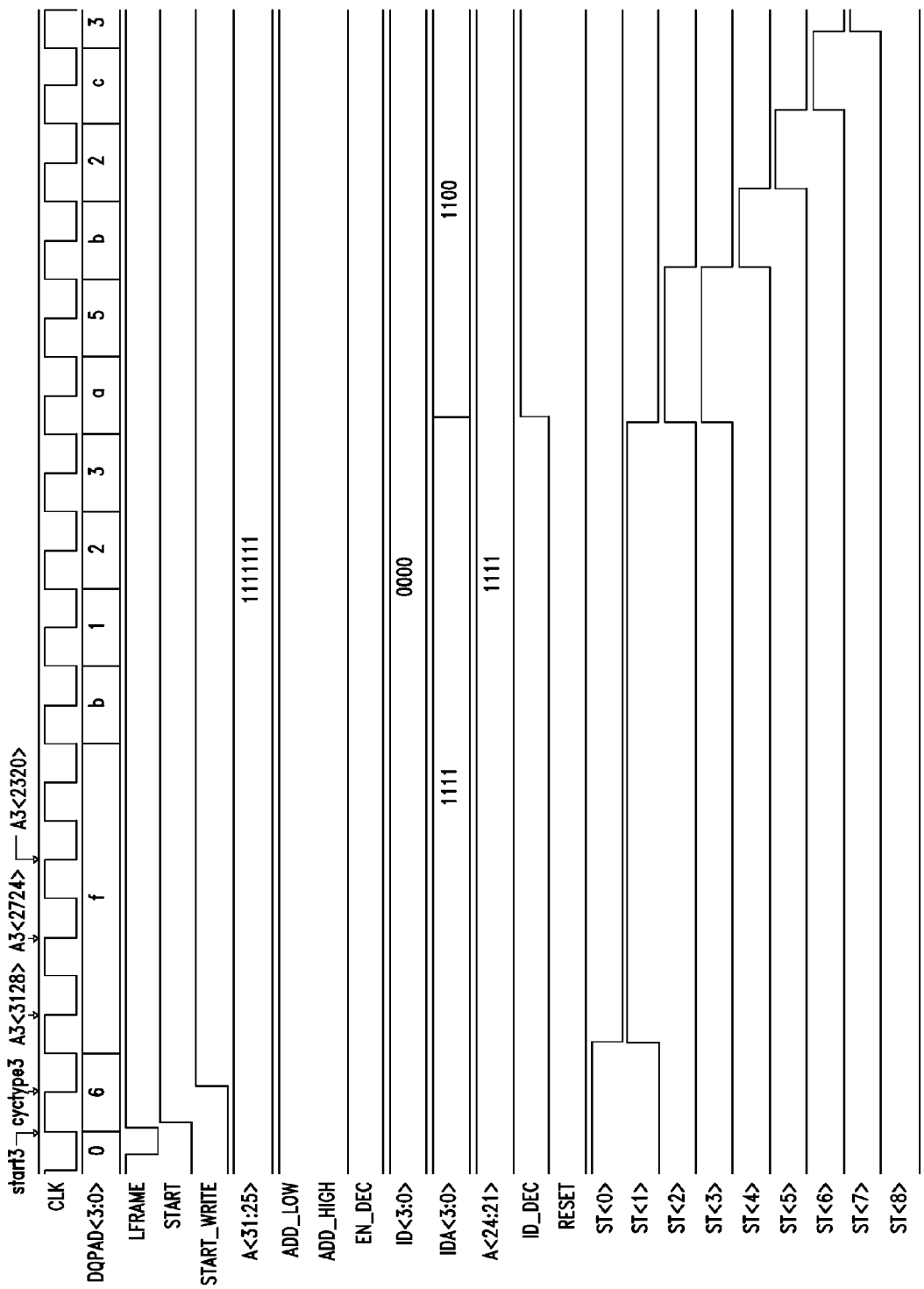
FIG. 8 shows the trend of a set of equally-time-based logic signals during a simulation of the operation of the logic of FIG. 5 with addressing bit values: A<31:25>=High, A<24:21>=High.
Figure 9:
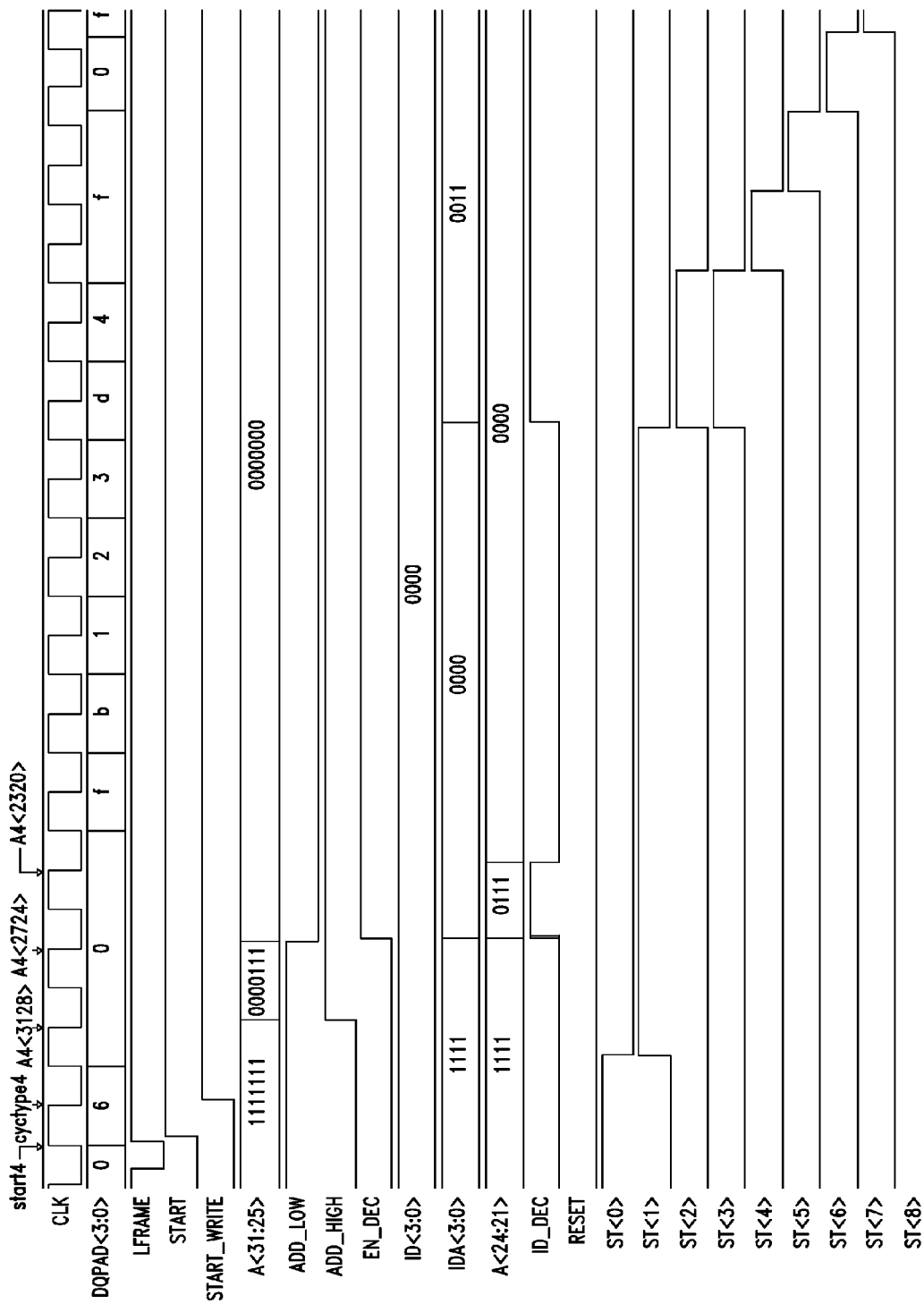
FIG. 9 shows the trend of a set of equally-time-based logic signals during a simulation of the operation of the logic of FIG. 5 with addressing bit values: A<31:25>=Low, A<24:21>=Low.

The remaining FIGS. 8 and 9 underline the case in which addresses A<31:21> are high (ADD_HIGH=L, ADD_LOW=H, EN_DEC=L, ID_DEC=L) and the case in which addresses A<31:21> are low (ADD_HIGH=H, ADD_LOW=L, EN_DEC=H, ID_DEC=L) with a subsequent correct address decoding. As it can be seen in these two figures no reset signal starts allowing the state machine to continue the following protocol LPC steps.

The solution provided by the present invention has the advantage of allowing the use of a memory to be inserted in a motherboard independently from the mapping mode of the memory itself and in the allowed addressing area. This solves the problem of using different memories according to the top-down or bottom-up mapping type which is specific of the motherboard being used since it can be adopted for any type of motherboard.

A considerable production cost saving is thus obtained since it is possible to provide a single set of masks and the testing step is favored by using a single routine set.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An automatic decoding method for mapping and selecting a non-volatile memory device having a LPC serial communication interface, wherein the memory is equipped with a plurality of addressing pins and mounted on a motherboard together with other memories of the same type bidirectionally connected with a controller putting it into communication with a processor housed in turn on the motherboard, comprising:
 a processor that compares the addressing pins of each memory with a portion of a plurality of addressing coding bits both to identify an addressing type to be used, top-down or bottom-up, and to determine which memory is polled by the controller for a given operation;
 wherein the addressing coding is a thirty-two-bit coding and the most significant bits A<31:25> are used to identify the addressing type, while some intermediate bits A<24:21> are used for being compared with the addressing pins to determine which memory is polled by the controller.

2. A method according to claim 1 wherein the comparison is performed in a LPC decoding block.

3. A method according to claim 1, wherein the most significant bits A<31:25> are processed in a selecting block in the LPC decoding to generate respective identification signals of the addressing type.

4. A method according to claim 3, wherein some intermediate bits A<24:21> are compared with the pins in a comparator block of said LPC decoding driven by an enabling signal generated by a generator block which receives at its input identification signals of the addressing type.

5. A method according to claim 4, wherein the generator block is enabled by a signal outputted by a register incorporating a CAM structure.

6. A non-volatile memory integrated device equipped with an interface with LPC serial protocol and a plurality of addressing pins in order to be mounted on a motherboard together with other memories of the same type bidirectionally connected with a controller putting it into communication with a processor housed in turn, on the motherboard, wherein:
 the processor contains in the LPC interface a logic identification structure both of the memory and of an addressing type to be used, top-down or bottom-up:
 the logic structure contains a comparator to compare a portion of a plurality of addressing coding bits with the addressing pins; and
 the addressing coding is a thirty-two-bit coding and the most significant bits A<31:25> are processed in a selector to generate respective identification signals of the addressing type, while some intermediate coding bits A<24:21 are compared in the comparator with the addressing pins to determine which memory is polled by the controller.

7. A device according to claim 6, wherein the comparison in the comparator is driven by an enabling signal generated by a generator block which receives at its input said identification signals of the addressing type.

8. A device according to claim 7, wherein the generator block is enabled by a signal outputted by a register incorporating a CAM structure.

9. A method for a memory selecting scheme in which one or more memory devices exist, comprising:
 reading identification signals indicating whether a top-down or bottom-up decoding scheme is used;
 selecting a particular memory device from one or more memory devices by matching the identification signals to a first set of addressing pins on the memory circuit; and
 addressing particular locations within the selected memory circuit with the appropriate scheme, whether top-down or bottom-up, using a second set of addressing pins on the selected memory circuit.

10. The method of claim 9 further comprising the step of sending a reset pulse if the identification signals do not indicate a unique decoding scheme.

11. The method of claim 9 further comprising the step of sending a reset pulse if there is not a direct match between the enabling signal and the bits residing on addressing pins of the memory circuit.

12. An automatic decoding method for mapping and selecting a non-volatile memory device having a communication interface, wherein the each memory device is equipped with a plurality of addressing pins and mounted on a motherboard together with other memories of the same type bidirectionally connected with a controller putting it into communication with a processor housed in turn on the motherboard, comprising:
 comparing the addressing pins of each memory device with a portion of the addressing coding bits;
 identifying the addressing type to be used, top-down or bottom-up, and determining which memory device is polled by the controller for a given operation, the addressing coding being a multi-bit coding and the most significant bits are used to identify the addressing type, whether top-down or bottom-up and some intermediate bits are used for being compared with the addressing pins to determine which memory is polled by the controller.

13. A non-volatile memory integrated device equipped with an interface with an address protocol and a plurality of addressing pins in order to be mounted on a motherboard as a plurality of memories of the same type bidirectionally connected with a controller putting it into communication with a processor housed in turn on the motherboard, wherein:

the processor contains an interface logic identification structure both of the memory and of the addressing type to be used, whether top-down or bottom-up; and the logic structure contains a comparator to compare a portion of the addressing coding bits with the addressing pins and wherein the addressing coding is a multi-bit coding and the most significant bits are processed in a selector to generate respective identification signals of the addressing type, and some intermediate coding bits are compared in the comparator with the addressing pins to determine which memory is polled by the controller.

14. The apparatus according to claim 13 wherein the comparator is driven by an enabling signal generated by a generator block which receives at its input said identification signals of the addressing type.

15. The apparatus according to claim 13 wherein the each of the memories are separate semiconductor devices and have distinct addressing pins from the other memories devices, the motherboard having a plurality of separately, packaged memory devices thereon as the memories.

* * * * *